United States Patent [19]

Golding et al.

[11] Patent Number: 5,477,377
[45] Date of Patent: Dec. 19, 1995

[54] OPTICAL SWITCHES AND DETECTORS UTILIZING INDIRECT NARROW-GAP SUPERLATTICES AS THE OPTICAL MATERIALS

[75] Inventors: Terry D. Golding, Missouri City; John H. Miller, Jr., Houston, both of Tex.; Jerry R. Meyer, Catonsville, Md.; Eric R. Youngdale, Alexandria, Va.; Filbert J. Bartoli, Upper Marlboro; Craig A. Hoffman, Columbia, both of Md.

[73] Assignees: University of Houston, Houston, Tex.; The United States of America as represented by the Secretary of the Navy, Washington, D.C.

[21] Appl. No.: 916,290

[22] Filed: Jul. 17, 1992

[51] Int. Cl.⁶ ............................................. G02F 1/35
[52] U.S. Cl. .............................. 359/326; 257/22; 257/15
[58] Field of Search ................................. 359/326–332; 257/2, 15–18, 22, 28

[56] References Cited

U.S. PATENT DOCUMENTS

| | | | |
|---|---|---|---|
| 4,250,515 | 2/1981 | Esaki et al. | 357/16 |
| 4,558,336 | 12/1985 | Chang et al. | 357/4 |
| 4,616,241 | 10/1986 | Biefeld et al. | 257/18 |
| 4,806,993 | 2/1989 | Voisin et al. | 357/4 |
| 4,916,495 | 4/1990 | Awano | 357/16 |
| 5,079,601 | 1/1992 | Esaki et al. | 357/4 |
| 5,159,421 | 10/1992 | Wolff | 357/30 |

FOREIGN PATENT DOCUMENTS 62-45064  2/1987  Japan.

OTHER PUBLICATIONS

A. Y. Cho and P. D. Dernier, "Single–crystal–aluminum Schottky–barrier diodes prepared by molecular–beam epitaxy (MBE) on GaAs," *J. Appl. Phys.* 49(6), Jun. 1978, pp. 3328–3332.

Peter C. Sercel and Kerry J. Vahala, "Type II broken–gap quantum wires and quantum dot arrays: A novel concept for self–doping semiconductor nanostructures," *Appl. Phys. Lett.* 57 (15) Oct. 8, 1990, pp. 1569–1571.

J. T. Zborowski et al., "Epitaxial and Interface Properties of InAs/InGaSb Multilayered Structures," *J. Appl. Phys.* 71(12), Jun. 15, 1992, pp. 5908–5912.

A. Y. Cho and P. D. Dernier, *J. Appl. Phys.*, 49:3328 (Jun. 1978).

J. Massies, P. Delescluse, P. Etienne and N. T. Linh, *Thin Solid Films*, 90, 113 (1982) (No Month).

J. R. Waldrop and R. W. Grant, *Appl. Phys. Lett.*, 34, 630 (May 1979).

G. A. Prinz and J. J. Krebs, *Appl. Phys. Lett.*, 39:397 (Sep. 1981).

(List continued on next page.)

*Primary Examiner*—John D. Lee
*Attorney, Agent, or Firm*—Fulbright & Jaworski

[57] ABSTRACT

The present invention relates to novel optical devices operating in the infrared, based on indirect narrow-gap superlattices (INGS) as the active optical materials. The novel optical devices include (1) wideband all-optical switches, which combine small insertion loss at low light intensities with efficient optical switching and optical limiting at high intensities, and (2) wideband infrared detectors with high collection efficiency and low tunneling noise currents, suitable for use in longwave infrared focal plane arrays. INGS comprise multiple semimetal/semiconductor layers having compatible crystal symmetry across each heterojunction between a given semimetal and the adjoining semiconductor, wherein each semimetal layer sandwiched between semiconductor layers is grown thin enough that each semimetal layer becomes a semiconductor, and wherein each semiconductor layer is thin enough that there is coupling between adjacent semiconductor layers. The present invention utilizes INGS, which are fabricated to meet the criteria $E_g^{ind} < \hbar\omega < E_g^{dir}$, especially where $\hbar\omega < 100$ meV, as the optical material for optical switches. The present invention also utilizes INGS as optical detectors if they are fabricated such that $E_g^{ind} < E_g^{dir} < \hbar\omega$, especially where $\hbar\omega$ is less than 155 meV.

7 Claims, 4 Drawing Sheets

OTHER PUBLICATIONS

G. A. Prinz, *Phys. Rev. Lett.*, 54, 1051 (Mar. 1985).

C. J. Palmstrom, N. Tabatabaie, and S. J. Allen, Jr., *Appl. Phys. Lett.*, 53, 2608 (Dec. 1988).

R. Fasche, J. T. Zborowski, T. D. Golding, H. D. Shih, P. C. Chow, K. Matsuichi, B. C. Covington, A. Chi, J. Zheng, and H. F. Schaake, *Jour. Cryst. Growth*, 111, 677 (1991). (No Month).

T. D. Golding, H. D. Shih, J. T. Zborowski, W. C. Fan, P. C. Chow, A. Vigliante, B. C. Covington, A. Chi, J. M. Anthony and H. F. Schaake, *J. Vac. Sci. Tech.*, B10(2) (Mar./Apr. 1992) 880–884.

J. T. Zborowski, W. C. Fan, T. D. Golding, A. Vigliante and P. C. Chow, *J. Appl. Phys.* 71 (12) (Jun. 1992) 5908–5912.

T. D. Golding, J. A. Dura, H. Wang, J. T. Zborowski, A. Vigliante and J. H. Miller, Jr., *Investigation of Sb/GaSb Multilayer Structures for Potential Application as an Indirect Narrow–Bandgap Material*, Semicond. Sci. Technol. 8 (1993) S117–S120 (No Month).

M. A. Hollis, K. B. Nichols, R. A. Murphy, R. P. Gale, S. Rabe, W. J. Piacenti, C. O. Bozler and P. M. Smith, *IEDM Tech. Digest*, 102(1985). (No Month).

N. Tabatabaie, T. Sands, J. P. Harbison, H. L. Gilchrist, and V. G. Keramidas, *Appl. Phys. Lett.*, 53, 2528 (Dec. 1988).

J. W. Sulhoff, J. L. Zyskind, C. A. Burrus, R. D. Feldman, and R. F. Austin, *Appl. Phys. Lett.*, 56, 388 (Jan. 1990).

M. L. Huberman and J. Maserjian, *Phys. Rev.*, 9065 (May 1988).

W. A. Little, *Phys. Rev.*, 134, A1416 (Jun. 1964).

V. L. Ginzburg, *Usp. Fiz. Nauk*, 101, 185 (Jun. 1970). [*Sov. Phys.–Usp.*, 13, 335 (Nov.–Dec. 1970)].

D. Allender, J. Bray, and J. Bardeen, *Phys. Rev.*, B7, 1020 (Feb. 1973).

C. M. Varma, P. B. Littlewood, S. Schmidt–Rink, E. Abrahams, and A. E. Ruckenstein, *Phys. Rev. Lett.*, 63, 1996 (Oct. 1989).

A. Virosztek and J. Ruvalds, *Phys. Rev. Lett.*, 67, 1657 (Sep. 1991).

I. Bozovic, *Phys. Rev.*, B42, 1969 (Aug. 1990).

I. Bozovic, J. H. Kim, J. S. Harris, Jr. and W. Y. Lee, *Phys. Rev.*, B43, 1169 (Jan. 1991).

J. H. Kim, I. Bozozic, C. B. Eom, T. H. Geballe and J. S. Harris, Jr., *Physica*, C174, 435 (1991). (No Month).

J. P. Tidman and R. F. Frindt, *Can. J. Phys.*, 54, 2306 (1976). (No Month).

F. J. DiSalvo and J. E. Graebner, *Solid State Commun.*, 23, 825 (1977). (No Month).

R. V. Coleman, B. Drake, P. K. Hansma and G. Slough, *Phys. Rev. Lett.*, 55, 394 (Jul. 1985).

A. I. Rusinov, D. Chan Kat and Yu V. Kopaev, *Sov. Phys. JETP, 38, 991 (May 1974).*

S. J. Allen, Jr. N. Tabatabaie, C. J. Palmstrom, G. W. Hull, T. Sands, F. DeRosa, H. L. Gilchrist and K. C. Garrison, *Phys. Rev. Lett.* 62, 2309 (May 1989).

T. Sands, *Appl. Phys. Lett.*, 52, 197 (Jan. 1988).

J. P. Harbison, T. Sands, N. Tabataie, W. K. Chan, L. T. Florez, and V. G. Keramidas, *Appl. Phys. Lett.*, 53, 1717 (Oct. 1988).

A. Zur and T. C. McGill, *J. Appl. Phys.*, 55, 378 (Jan. 1984).

J. E. Cunningham, J. A. Dura and C. P. Flynn, in Metalic Multilayer and Epitaxy, ed. by M. Hong, S. Wolf and D. C. Gubser, *Metallurgical Society Inc.* (1988), No Month, pp. 77–95.

C. N. Berglund, *IEEE Trans. Electron* DEV.Ed–16, 432 (May 1969).

D. L. Mitchell, P. C. Taylor and S. G. Bishop, *Solid State Comm.* 9 1833 (1971). (No Month).

P. A. Wolff and S. Y. Auyang, *Semicond. Sci. Technol.* 5, S57 (1990). (No Month).

E. R. Youngdale, C. A. Hoffman, J. R. Meyer, F. J. Bartoli, J. W. Han, J. W. Cook, Jr., J. F. Schetzina, M. A. Engelhardt, E. W. Niles and H. Hochst, *J. Vac. Sci. Technol.* A 8, 1215 (1990). Mar./Apr.

E. R. Youngdale, C. A. Hoffman, J. R. Meyer, F. J. Bartoli, M. A. Engelhardt and H. Hochst, *Semicond. Sci. Technol.* 5, S253 (1990). (No Month).

E. R. Youngdale, J. R. Meyer, C. A. Hoffman, F. J. Bartoli and A. Martinez, *Solid State Comm.* 80, 95 (1991). (No Month).

E. R. Youngdale, J. R. Meyer, C. A. Hoffman, F. J. Bartoli, D. L. Partin, C. M. Thrush and J. P. Heremans, *Appl. Phys. Lett.* 57:336 (Jul. 1990).

E. R. Youngdale, J. R. Meyer, C. A. Hoffman, F. J. Bartoli, D. L. Partin, C. M. Thrush and J. P. Heremans, *Appl. Phys. Lett.* 59, 756 (1991). Aug.

E. R. Youngdale, J. R. Meyer, F. J. Bartoli and C. A. Hoffman, *Int. J. Nonlinear Opt. Phys.*, vol. 1, No. 3 (1992) 493, to 531. (No Month).

R. M. Broudy and V. J. Masurezyk, *Semiconductors and Semimetals*, vol. 18, ed. R. K. Willardson and A. C. Beer (Academic, N.Y., 1981), Chapter 5. (No Month).

M. B. Reine, A. K. Sood and T. J. Tredwell, *Semiconductors and Semimetals*, vol. 18, ed. R. K. Willardson and A. C. Beer (Academic, N.Y., 1981), Chapter 6. (No Month).

M. A. Kinch and M. W. Goodwin, *J. Appl. Phys.* 58, 4455 (Dec. 1985).

J. R. Meyer, F. J. Bartoli, E. R. Youngdale and C. A. Hoffman, *J. Appl. Phys.* 70, 4317 (Oct. 1991).

S. C. Shin, J. E. Hilliard and J. B. Ketterson, *J. Vac. Sci. Technol.* A2, 296 (1984). (Apr./Jun.).

A. diVenere, H. K. Wong, G. K. Wong and J. B. Ketterson, *Superlatt. Microstruct.* 1, 21 (1985). (No Month).

T. D. Golding, J. A. Dura, H. Wang, J. T. Zborowski, A. Vigliante, D. C. Chen, J. H. Miller, Jr. and J. R. Meyer, *Semicond. Sci. Technol.*, 8 (1993) S117–S120. (No Month).

B. D. Cullity, Elements of X–ray Diffraction, Addison–Wesley 32–81 (2nd ed.) (No Date).

M. A. Herman and H. Sitter, Molecular Beam Epitaxy, Springer–Verlag (1989). (No Month) pp. 1–28.

J. P. Issi, *Aust. J. Phys.* 32, 585 (1979). (No Month).

K. Kash, P. A. Wolff and W. A. Bonner, *Appl. Phys. Lett.* 42, *173 (Jan. 1983).*

K. Seeger, *Semiconductor Physics (Springer–Verlag, New York, 1973), pp. 413–418. (No Month).*

J. Heremans, D. T. Morelli, D. L. Partin, C. H. Olk, C. M. Thrush and T. A. Perry, *Phys. Rev. B.* 38, 10280 (Nov. 1988).

OPTICAL SWITCHES AND DETECTORS UTILIZING INDIRECT NARROW-GAP SUPERLATTICES AS THE OPTICAL MATERIALS

SPECIFICATION

1. Field of the Invention

The invention relates to novel optical devices operating in the infrared (IR), based on indirect narrow-gap superlattices (INGS) as the active optical materials. The INGS are a new type of semiconductor material that is fabricated by using semimetal/semiconductor multilayers. The novel optical devices include (1) wideband all-optical switches, which combine small insertion loss at low light intensities with efficient optical switching and optical limiting at high intensities, and (2) wideband infrared detectors with high collection efficiency and low tunneling noise currents, suitable for use in longwave infrared (LWIR) focal plane arrays.

2. Background of the Invention

Wideband optical switches are needed in several IR technologies, for example optical communications, image processing and countermeasures. The requirements for such wideband optical switches include low insertion loss, low threshold for switching, large dynamic range, high threshold for switch damage, and operation at a wide range of pulse length (subnanoseconds to seconds).

In the prior art, the best attempts at partially satisfying optical switch requirements at $CO_2$ wavelengths have involved using switches based on induced opaqueness. These have employed materials which undergo a thermally-induced phase transition, for example $VO_2$, or materials which display thermal runaway, for example chalcogenide glasses. However, since excess energy is absorbed by the switch itself in these prior art devices, heat dissipation has been a significant problem. Switch heating and damage ultimately limit the performance at long pulses of these prior art devices. Furthermore, a thermal bias, typically 60°–120° C., is generally required, which in IR sensor systems has the undesired effect of increasing the thermal background.

Induced scattering, self-focusing, self-defocusing, and total internal reflection have also been suggested as mechanisms which could yield wideband optical switching. However, whereas theoretical models predict that switching should be achievable using these approaches, a lack of IR materials with suitable properties has prevented the development of practical devices. Switch operation using any of these mechanisms at $CO_2$ wavelengths has previously been demonstrated only in narrow regimes. The requirements for the materials suitable for these mechanisms include a strong optical nonlinearity, nonlinear response to both short and long pulses, low absorption coefficient at IR wavelengths, and high damage threshold.

It has recently been shown experimentally that narrow-gap semiconductors and semimetals satisfy some of these requirements, since they have strong, wideband nonlinearities in the IR due to optical modulation of free carrier susceptibility. High nonlinear optical coefficients have been reported for $Hg_{1-x}Cd_xTe$, HgTe, HgTe—CdTe superlattices, $\alpha$-$Sn_{1-x}Ge_x$, $Pb_{1-x}Sn_xSe$, and $Bi_{1-x}Sb_x$. See P. A. Wolff and S. Y. Auyang, *Semicond. Sci. Technol.* 5, S57 (1990); E. R. Youngdale, C. A. Hoffman, J. R. Meyer, F. J. Bartoli, X. Chu, J. P. Faurie, J. W. Han, J. W. Cook, Jr. and J. F. Schetzina, *J. Vac. Sci. Technol.* A 7, 365 (1989); E. R. Youngdale, C. A. Hoffman, J. R. Meyer, F. J. Bartoli, J. W. Han, J. W. Cook, Jr., J. F. Schetzina, M. A. Engelhart, E. W. Niles and H. Hochst, *J. Vac. Sci. Technol.* A 8, 1215 (1990); E. R. Youngdale, C. A. Hoffman, J. R. Meyer, F. J. Bartoli, M. A. Engelhart and H. Hochst, *Semicond. Sci. Technol.* 5, S253 (1990); E. R. Youngdale, J. R. Meyer, C. A. Hoffman, F. J. Bartoli and A. Martinez, *Solid State Comm.* 80, 95 (1991); E. R. Youngdale, J. R. Meyer, C. A. Hoffman, F. J. Bartoli, D. L. Partin, C. M. Thrush and J. P. Heremans, *Appl. Phys. Lett.* 57, 336 (1990); and E. R. Youngdale, J. R. Meyer, C. A. Hoffman, F. J. Bartoli, D. L. Partin, C. M. Thrush and J. P. Heremans, *Appl. Phys. Lett.*, 59, 756 (1991), which are incorporated herein by reference. For example, recent experiments on thin films of Bi and $Bi_{1-x}Sb_x$ alloys have yielded the largest third-order nonlinear susceptibilities ($\chi^{(3)}$) ever reported for $CO_2$ wavelengths at high powers. See E. R. Youngdale, J. R. Meyer, C. A. Hoffman, F. J. Bartoli, D. L. Partin, C. M. Thrush and J. P. Heremans, *Appl. Phys. Lett.*, 59, 756 (1991). At temperatures as high as 100 K and optical intensities up to $2 \times 10^5$ W/cm$^2$, $\chi^{(3)} > 6 \times 10^{-4}$ esu has been observed. However, bulk Bi and $Bi_{1-x}Sb_x$ alloys have two flaws which prevent them from being attractive in IR nonlinear devices. First, the linear absorption coefficient $\alpha \approx 10^4$ cm$^{-1}$ of these alloys is much too large to allow transparency at the 3–8 µm thicknesses required for devices. Second, even larger nonlinearities in these alloys would be possible if the recombination lifetime were longer, since $\Delta n \approx \tau_r$ and the Auger lifetime is quite short probably less than 1 ps) due to the semi-metallic band alignment. The same limitations apply to the other direct-gap materials cited above. Although a small absorption coefficient and longer lifetime can be achieved by tuning the energy gap of the semiconductor close to the photon energy, the dynamic Burstein shift then causes the nonlinearity to saturate at a nonlinear index change far too low to be useful in optical devices. See E. R. Youngdale, J. R. Meyer, F. J. Bartoli and C. A. Hoffman, *Int. J. Nonlinear Opt. Phys.* Vol. 1, No. 3 (1992) 493,531, which is incorporated herein by reference.

Current LWIR focal plan array technology has been based primarily on the $Hg_{1-x}Cd_xTe$ alloy. See R. M. Broudy and V. J. Mazurezyk, *Semiconductors and Semimetals*, Vol. 18, ed. R. K. Willardson and A. C. Bear (Academic, New York, 1981), Chapter 5; and M. B. Reine, A. K. Sood and T. J. Tredwell, *Semiconductors and Semimetals*, Vol. 18, ed. R. K. Willardson and A. C. Beer (Academic, New York, 1981), Chapter 6, which are incorporated herein by reference. However, detectors employing $Hg_{1-31 x}Cd_xTe$ are plagued by several limitations which are intrinsic either to the material itself or to its fabrication requirements. First, the large mass ratio in $Hg_{1-x}Cd_xTe$ of $m_p^*/m_n^* \approx 100$, where $m_n^*$ and $m_p^*$ are the electron and hole effective masses respectively, is highly conducive to Auger recombination, which limits the quantum efficiency of photoconductive and photovoltaic detectors. Second, photovoltaic detectors with small electron mass cause large tunneling noise currents, which vary exponentially with $(m^*)^{-1}$. "See M. A. Kinch and M. W. Goodwin, *J. Appl. Phys.* 58, 4455 (1985), which is incorporated hereby by reference. For a given cutoff wavelength, there is no independent control over $m_n^*$ in the alloy, since the mass is proportional to direct energy gap: $m_n^* \propto E_g^{dir}$. Third, Hg-based growth has been difficult and expensive, and although the high uniformity coefficient achievable for $Hg_{1-x}Cd_xTe$ is adequate ($\approx$1000–2000 cm$^{-1}$), a larger value would be preferable since detectors with much thinner active areas may then be fabricated. Although it has been demonstrated in recent years that GaAs quantum well IR photodetectors (QWIP) can overcome some of these limitations, QWIP devices are unsuitable for many applications because their detectivities will always be far smaller than those attainable with $Hg_{1-x}Cd_xTe$.

Therefore, a need exists for optical materials which overcome the limitations of the prior art optical switch and optical detector devices.

SUMMARY OF THE INVENTION

The present invention utilizes indirect narrow-gap superlattices (INGS) as the active optical material for nonlinear optical switches and optical detection devices. The advantages of employing INGS structures as the nonlinear medium in optical switches include: (1) controlled tuning of the nonlinear properties; (2) lower absorption coefficient; (3) longer recombination lifetime; (4) enhanced saturation properties; and (5) increased resistance to switch damage.

In IR optical detectors, INGS structures will have the following advantages over prior art $Hg_{1-x}Cd_xTe$ optical detection devices: (1) larger absorption coefficient which allows thinner devices with high quantum efficiency; (2) greatly-enhanced Auger and Shockicy-Read recombination lifetimes due to intervalley hole transfer and the indirect band alignment; (3) orders-of-magnitude reductions in the tunneling noise due to the larger effective mass along the growth axis; (4) higher uniformity with zincblende III-V semiconductor material growth; and (5) greater convenience of growth not involving Hg.

INGS comprise multiple semimetal/semiconductor layers having compatible crystal symmetry across each heterojunction between a given semimetal and the adjoining semiconductor, wherein each semimetal layer sandwiched between semiconductor layers is grown thin enough that each semimetal layer becomes a semiconductor, and wherein each semiconductor layer is thin enough that there is coupling between adjacent semiconductor layers.

The first semimetal/semiconductor layer in the INGS is fabricated by growing a rhombohedral semimetal in a [111] direction on a substrate material having a (111) orientation, and then growing a zincblende semiconductor in a [111] direction on the rhombohedral semimetal. Alternating layers of rhombohedral semimetal, grown in a [111] on the preceding semiconductor layer grown, and zincblende semiconductor, grown in a [111] direction on the preceding semimetal layer grown, are then fabricated on the first layer. The number of semimetal/semiconductor layers grown is dependent on the application of the semimetal/semiconductor multilayer structure. Generally, more than ten semimetal/semiconductor layers are grown. Suitable rhombohedral semimetals include $Bi_xSb_{1-x}$, or As, while suitable zincblende semiconductors include $In_xGa_{1-x}Sb$, $In_xGa_{1-x}As$, $Al_xGa_{1-x}As$, $Al_xGa_{1-x}Sb$, CdTe or PbTe, where x ranges from zero to one. The substrate material can comprise numerous materials including, but not limited to $In_xGa_{1-x}Sb$, $In_xGa_{1-x}As$, $Al_xGa_{1-x}As$, $Al_xGa_{1-x}Sb$, or $Al_2O_3$.

The thickness $L_z$ of each semimetal sandwiched between semiconductors must be comparable to or less than the de Broglie wavelength of the carriers. In general, the thickness $L_z$ must be less than 400 Å.

The INGS may be grown by any low temperature epitaxial growth process. Suitable low temperature epitaxial growth processes include molecular beam epitaxy, chemical beam epitaxy, and metal organic chemical beam epitaxy.

The inventors have realized that a semiconductor material having a narrow indirect energy gap, wherein the indirect energy gap $E_g^{ind}$ is less than $\hbar\omega$ and the direct energy gap $E_g^{dir}$ is greater than $\hbar\omega$, is suitable as the active optical material for optical switches. Although semiconductor materials meeting the criteria $E_g^{ind}<\hbar\omega<E_g^{dir}$ have existed for $\hbar\omega>155$ meV in the prior art, there have been no materials meeting this criteria for $\hbar\omega<155$ meV. Photon energy of less than 155 meV occurs for long wavelength infrared (LWIR) wavelengths.

The present invention utilizes INGS, which are fabricated to meet the criteria $E_g^{ind}<\hbar\omega<E_g^{dir}$, especially where $\hbar\omega<155$ meV, as the optical material for optical switches. INGS may also be utilized as optical detectors if they are fabricated such that $E_g^{ind}<E_g^{dir}<\hbar\omega$. If the optical detectors are operating in the LWIR, $\hbar\omega$ is less than 155 meV, and INGS are the only known material capable of satisfying this criteria.

INGS systems based on $Bi_{1-x}Sb_x$, where x ranges from zero to one, and a suitable semiconductor may be fabricated to satisfy the energy gap requirements for the optical materials used in optical switches and detectors. Specific INGS materials suitable for the optical material in switches and detectors include $Bi_{1-x}Sb_x$—CdTe, $Bi_{1-x}Sb_x$—PbTe, $Bi_{1-x}Sb_x$—GaSb, or $Bi_{1-x}Sb_x$—InSb.

An example of a particular embodiment utilizing an INGS as the optical material is an optical switch employing total internal reflection. An INGS satisfying the criteria $E_g^{ind}<\hbar\omega<E_g^{dir}$ is the nonlinear medium of the switch, and a semiconductor having a refractive index equal to $n_o$ is the linear medium of the switch. The nonlinear medium is embedded at an angle θ in the linear medium. The optical switch has characteristics such that it switches from near 100% transmission to a near 100% reflecting state depending on whether the input light intensity is low or high.

The INGS should also be useful in other switching configurations such as self-defocusing. INGS are also ideally suited for optical bistability.

BRIEF DESCRIPTION OF THE DRAWINGS

A better understanding of the present invention can be obtained when the following detailed description is read in conjunction with the following drawings in which.

DETAILED DESCRIPTION OF THE INVENTION

Figure 1:
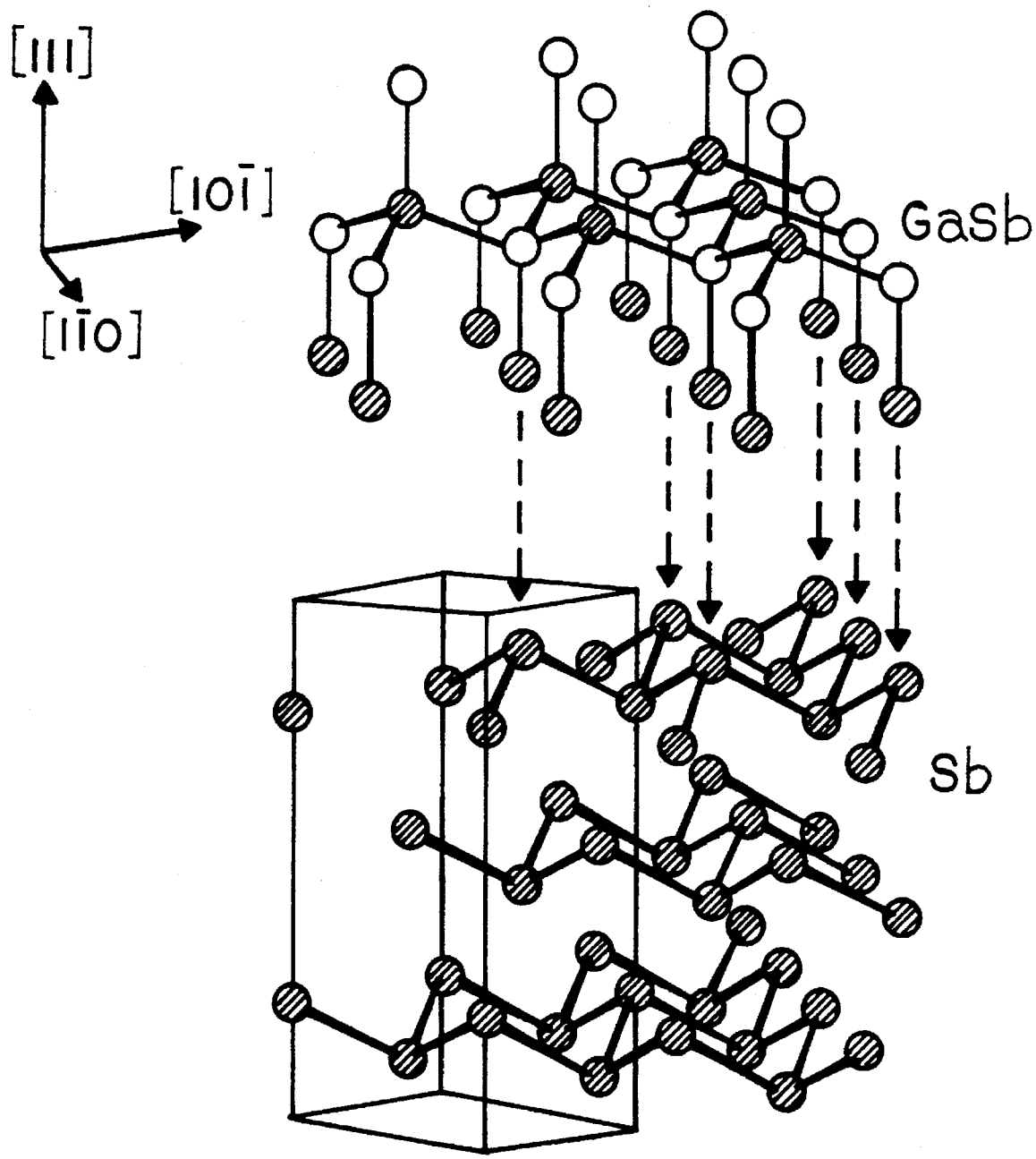
FIG. 1 is a perspective view illustrating compatible crystal symmetry across the heterojunction between rhombohedral semimetal and zincblende semiconductor crystals in accordance with the present invention.

The present invention overcomes the limitations of the prior art nonlinear optical switches and optical detection devices by employing Bi-based and Sb-based indirect; narrow-gap superlattices (INGS) as the active IR optical materials. For nonlinear optical switching, INGS should display a reduced absorption coefficient and order of magnitude longer Auger recombination lifetime without sacrificing nonlinear response. For optical detectors, the band alignment may be arranged so that the absorption is quite large while the lifetime remains long. These systems have never been implemented or suggested for implementation in non-linear optical or detector applications.

It was discussed above that due to their small effective masses, conventional narrow-gap semiconductors display large optical nonlinearities associated with free-carrier plasma generation. The nonlinear change of the refractive index, $n^2$, which is proportional to $\chi^{(3)}$, is given by $\Delta n = n_2 I$, where I is the optical intensity, $$n_2 \propto -\Delta N/m^* \propto \Delta N/E_g^{dir},$$

and $\Delta N$ is the optical modulation of the carrier density. While the performance of prior art direct-gap materials in optical devices is severely limited by saturation due to the dynamic Burstein shift at high optical intensities, see E. R. Youngdale, J. R. Meyer, F. J. Bartoli and C. A. Hoffman, *Int. J. Nonlinear Opt. Phys.* Vol. 1, No. 3 (1992) 493,531, which is incorporated herein by reference, it is disclosed herein that the saturation properties may be substantially improved by employing a semiconductor with a narrow, indirect energy gap. In the limit $E_{Fsat} \ll E_g^{dir}$ one obtains: $\Delta n_{sat} \propto (E_g^{dir})^{1/2} E_{Fsat}^{3/2}$ where $E_{Fsat}$ is the Fermi energy at saturation, $E_g^{dir}$ is the direct energy gap, and $\Delta n_{sat}$ is the change limited by the dynamic Burstein shift. See J. R. Meyer, F. J. Bartoli, E. R. Youngdale and C. A. Hoffman, *J. Appl. Phys.* 70, 4317 (1991), which is incorporated herein by reference. Thus, even though $n_2$ at low intensities increases monotonically with decreasing $E_g^{dir}$ (see above equation), optimization of the nonlinear response at saturation actually favors a large gap, as long as one can increase $E_g^{dir}$ without decreasing $E_{Fsat} = \hbar\omega - E_g$ ($E_g$ is the smaller of the direct and indirect gaps). See E. R. Youngdale, J. R. Meyer, C. A. Hoffman, F. J. Bartoli, D. L. Partin, C. M. Thrush and J. P. Heremans, *Appl. Phys. Lett.*, 59, 756 (1991), which is incorporated herein by reference. While these requirements are contradictory in semiconductors with direct, positive gaps, both requirements can be simultaneously accomplished in all indirect-gap material for which $E_g^{ind} < \hbar\omega < E_g^{dir}$, where $E_g^{ind}$ is the indirect energy gap. See J. R. Meyer, F. J. Bartoli, E. R. Youngdale and C. A. Hoffman, *J. Appl. Phys.* 70, 4317 (1991). One maximizes $\Delta n_{sat}$ by making $E_g^{dir}$ large, to maximize the density of states, and $E_g^{ind}$ small, to maximize $E_{Fsat}$. The indirect band alignment also has the advantage of yielding a smaller absorption coefficient.

Although semiconductor materials meeting the criteria $E_g^{ind} < \hbar\omega < E_g^{dir}$ have existed for $\hbar\omega > 155$ meV in the prior art, there have been no materials meeting this criteria for $\hbar\omega < 100$ meV. Photon energy of less than 100 meV occurs for infrared (IR) wavelengths.

Although there have been no naturally-occurring bulk materials having the required indirect band alignment, $E_g^{ind} < 100$ meV$< E_g^{dir}$, the present invention provides INGS which can be fabricated artificially by taking advantage of quantum confinement in superlattices containing Bi (e.g., Bi—PbTe or Bi—CdTe), Sb (e.g., Sb—GaSb)) or $Bi_{1-x}Sb_x$, (e.g., $Bi_{1-x}Sb_x$—CdTe, $Bi_{1-x}Sb_x$—PbTe, $Bi_{1-x}Sb_x$—GaSb, or $Bi_{1-x}Sb_x$InSb). See S. C. Shin, J. E. Hilliard and J. B. Ketterson, *J. Vac. Sci. Technol.* A2, 296 (1984); A. .diVenere, H. K. Wong, G. K. Wong and J. B. Ketterson, *Superlatt. Macrostruct.* 1, 21 (1985); T. D. Golding, J. A. Dura, H. Wang, J. T. Zborowski, A. Vigliante, H. C. Chen, J. H. Miller, Jr. and J. R. Meyer, *Semicond. Sci. Technol.* 8(1993)5117–5210, which are incorporated herein by reference.

INGS comprise multiple semimetal/semiconductor layers having compatible crystal symmetry across each heterojunction between a given semimetal and the adjoining semiconductor, wherein each semimetal layer sandwiched between semiconductor layers is grown thin enough that each semimetal layer becomes a semiconductor, and wherein each semiconductor layer is thin enough that there is coupling between adjacent semiconductor layers.

It has been discovered that single layer and multilayer semimetal/semiconductor structures can be fabricated with rhombohedral semimetals having a (111) orientation and zincblende semiconductors having a (111) orientation. Suitable rhombohedral semimetals include $Bi_xSb_{1-x}$ or As, while suitable zincblende semiconductors include $In_xGa_{1-x}Sb$, $In_xGa_{1-x}As$, $Al_xGa_{1-x}As$, $Al_xGa_{1-x}Sb$, CdTe or PbTe, where x ranges from zero to one. See U.S. patent application No. 07/916,050 by T. Golding and J. Miller, entitled "Semimetal-Semiconductor Heterostructures and Multilayers," filed concurrently herewith, which is incorporated herein by reference.

The following discussion relates to the fabrication of a GaSb/Sb semiconductor/semimetal heterostructure, however the discussion is also relevant to fabrication of other rhombohedral semimetal/zincblende semiconductor structures. The bulk structure of Sb is rhombohedral (trigonal) lattice parameter a=4.506 Å and $\alpha$=57.11°, see Elements of X-ray Diffraction, B. C. Cullity, Addison-Wesley pp. 32–81 (2nd Ed.) which is incorporated herein by reference, while GaSb is zincblende with a=6.096 Å. The (111) plane of Sb forms a hexagonal net which is structurally nearly identical to that of GaSb in its (111) plane. The in-plane interatomic distance in Sb and GaSb is 4.308 Å and 4.310 Å, respectively, resulting in a (111) planar mismatch, $\Delta aj/ai$, of only 0.0006 (at 273 K). Therefore, formation of defect free, strainless interfaces are a possibility with this system if grown on the (111) orientation. In addition, the coefficients of linear expansion of Sb and GaSb are comparable ($\alpha_{GaSb}$= 6.9×10$^{-6}$, $\alpha_{Sb}$=9×10$^{-6}$) and potential cross doping effects which have been of concern in some of the prior art mixed semimetal/semiconductor combinations are eliminated because Sb is common in Sb/GaSb structures. FIG. 1 illustrates compatible crystal symmetry across the heterojunction between the zincblende semiconductor crystal GaSb and the rhombohedral semimetal crystal Sb.

Figure 2:
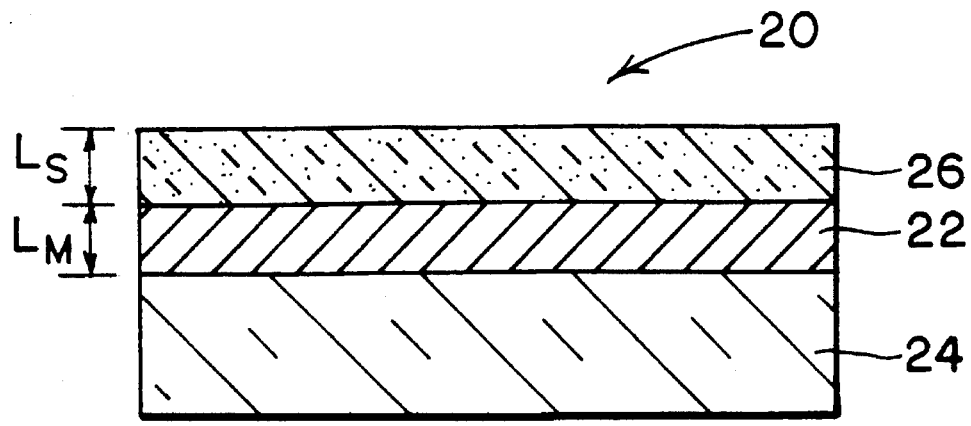
FIG. 2 is a side view of a single layer semimetal/semiconductor heterostructure in accordance with the present invention.

The semiconductor/semimetal structures can be grown by any low temperature epitaxial growth process. In order to ensure that the common crystal symmetry is exploited the semimetal and semiconductor layers must be grown along the [111] direction, and this necessitates growth on a (111) oriented substrate or template that has an atomic surface structure that is six fold symmetric. Suitable substrates include, but are not limited to $In_xGa_{1-x}Sb$, $In_xGa_{1-x}As$, $Al_xGa_{1-x}As$, or $Al_xGa_{1-x}Sb$. Specific examples of suitable substrates are InAs(111), GaSb(111), GaAs(111) or sapphire(111) ($Al_2O_3$). In general, to fabricate a single layer semimetal/semiconductor heterostructure 20 (see FIG. 2), a rhombohedral semimetal 22 is grown in a [111] direction on substrate 24 having a (111) orientation. A zincblende semiconductor 26 is then grown in a [111] direction on semimetal 22.

The following is a more detailed description of the fabrication of a semimetal/semiconductor structure. Although the discussion is limited to a Sb/GaSb structure, it is equally applicable to the range of rhombohedral semimetals, and the zincblende semiconductor materials previously mentioned.

The Sb semimetal and GaSb semiconductor films are grown by molecular beam epitaxy (MBE) in a commercial (Riber 32) growth chamber, using a standard Sb effusion cell producing $Sb_4$, and a standard liquid-metal Ga source. See "Molecular Beam Epitaxy" Ed. M.a. Herman and H. Sitter, Springer-Verlag (1989) which is incorporated herein by reference; see also T. D. Golding, J. A. Dura, W. C. Wang, J. T. Zborowski, A. Viliante, and J. H. Miller, Jr., "Investigation of Sb/GaSb Multilayer Structures for Potential Application as a Narrow Bandgap System," Accepted for presentation at the International Conference on Narrow-Gap Semiconductors, University of Southhampton, U.K., 19–23 Jul. 1992. Other growth techniques besides MBE, such as chemical beam epitaxy, and metal organic chemical beam epitaxy are equally suitable. The substrates employed are GaSb(111)A and (111)B oriented, and are indium-bonded to Molybdenum blocks. Homoepitaxial GaSb buffer layers of approximately 0.5 μm may be grown prior to epilayer or multilayer growth, although this is not essential. Molecular fluxes are determined from measurements by an ion gauge interposed in the beam path. Substrate temperatures above 425° C. are measured by an optical pyrometer, and below 425° C. are estimated by extrapolating readings from a thermocouple mounted behind the sample block. Growth is monitored by in-situ reflection high energy electron diffraction (RHEED). Growth rates for Sb are calibrated by Rutherford backscattering spectrometry (RBS), and growth rates for GaSb by RHEED intensity oscillations and RBS.

Epitaxial grown of Sb on both GaSb (111)A and (111)B is achieved by increasing the Sb residence lifetime on the GaSb surface by lowering the temperature below a nucleation temperature, $T_n(J_{Sb})$, which is independent of the growth orientation. For $J_{Sb}=7\times10^{-7}$ torr, $T_n$ is equal to 260° C. for epitaxial growth of Sb on GaSb. For epitaxy on both GaSb (111)A and (111)B, initial growth is slow and simultaneous diffraction from epitaxial Sb and GaSb is observed by reflection high energy electron diffraction (RHEED). A streaked, well defined (1×1) RHEED pattern, showing single phase, two dimensional growth results after surface coverage is complete. It is noted that with nearly identical surface nets, the (111) Sb is distinguishable from (111)A or (111)B GaSb only by the RHEED surface reconstructions. At $T_n$, and with the flux ratios $J_{Sb}/J_{Ga}\approx1.1$, the surface reconstructions for GaSb(111)A and (111)B are 5×2 and 2×8, respectively. Unlike GaSb, the Sb surface has inversion symmetry about the 111 plane and has a 1×1 reconstruction regardless of whether grown on GaSb (111)A or (111)B. Epitaxial growth, once established, may be continued to approximately 200° C. Below this temperature, diffraction rings indicative of polycrystalline grown are observed.

It is noted that with Sb flux constantly present on the GaSb surface, slow initial growth, where surface accommodation and desorption are only slightly unbalanced, is a critical condition for epitaxy. For example, if the surface concentration of Sb is increased rapidly, by cooling quickly through $T_n$, multiply oriented, three-dimensional growth occurs. However, and most importantly, Sb may be successfully nucleated below $T_n$ if the GaSb surface is not exposed to a Sb flux for a period of several seconds.

After deposition of the Sb layer to the required thickness, GaSb can be grown epitaxially on top of the Sb layer by standard MBE growth techniques, and the fabrication of a single layer semimetal/semiconductor heterostructure is complete. To fabricate a multilayer semimetal/semiconductor structure, another Sb layer may be grown on top of the just grown GaSb layer by the technique described above, and then another GaSb layer may be grown by standard MBE growth techniques on the just grown Sb layer. This pattern is repeated until the desired number of alternating semimetal and semiconductor layers have been fabricated.

Figure 3:
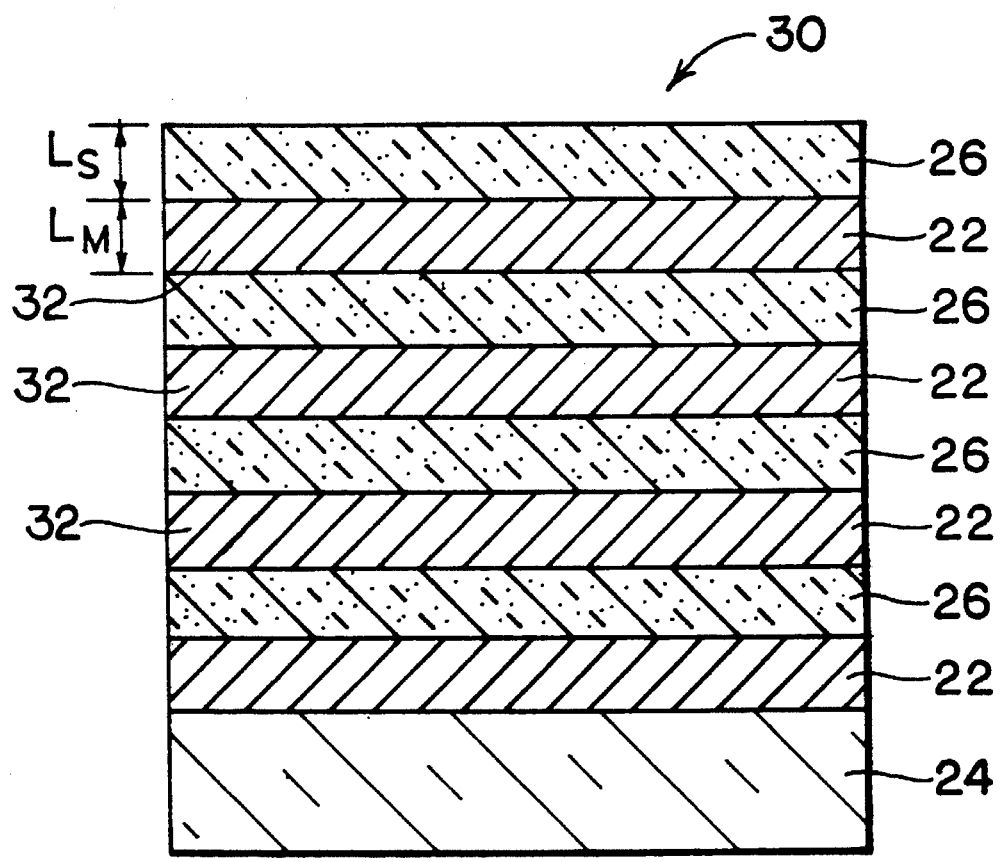
FIG. 3 is a side view of a multilayer semimetal/semiconductor structure in accordance with the present invention.

A schematic of a generic semimetal/semiconductor multilayer structure 30 is shown in FIG. 3. FIG. 3 illustrates substrate 24 and multiple semimetal layers 22 and semiconductor layers 26. The number of semimetal/semiconductor layers is dependent on the device or device characteristics required. Generally, more than ten layers are grown. It is also noted that the semimetal/semiconductor combinations employed in the semimetal/semiconductor structure are dependent on device characteristics desired, but are restricted to those combinations with close lattice match, such as GaSb/Sb. If the thickness ($L_s$) of each semiconductor layer is thin enough that there is coupling between adjacent semiconductor layers, a superlattice results. As will be discussed below, to form an indirect narrow-gap superlattice (INGS) the thickness $L_m$ for each semimetal sandwiched between these semiconductor layers is made thin enough, in accordance with the quantum size effect, that the semimetal becomes a semiconductor.

The quantum size effect is generally defined as a dependence of the thermodynamic properties and kinetic coefficients of a solid on its characteristic geometric dimensions when the latter becomes comparable to or less than the de Broglie wavelength of the charge carriers. When the thickness of the solid ($L_z$) is comparable to or less than the de Broglie wavelength of the solid's carriers, quantization of the carrier motion occurs.

In the absence of quantum confinement As, Sb, Bi, or $Bi_xSb_{1-x}$, are semimetals. For these materials the conduction band minimum (3-fold degenerate at the L-point) lies at a lower energy than the valence band maximum (6-fold at the H-point in Sb, 1-fold at the T-point in Bi). The overlap of the two bands is ≈180 meV in Sb and ≈40 meV in Bi. If the semimetal layers are spacially confined by sandwiching the semimetal film between layers of a suitable barrier material, such as GaSb, AlSb or InAs, then by decreasing the thickness of each semimetal layer, the conduction band will move up in energy, while the valence band will move down. See FIG. 4a for a diagram of energy versus wavenumber (k) for Bi or Sb [Bi, Sb] in bulk form, and FIG. 4b for a diagram of energy versus wavenumber (k) for Bi or Sb [Bi, Sb] confined in a quantum well. In the multilayer semimetal/semiconductor structures described above, semiconductor layers 26 sandwiching semimetal layers 32 are suitable barrier material. See FIG. 3. Using appropriate effective masses, see J. P. Issi, Aust. J. Phys., 32, 585 (1979) which is incorporated herein by reference, the two bands should cross at $L_z\approx100$ Å, where $L_x$ and $L_y$ may be much greater than $L_z$, at which point the semimetal becomes an indirect narrow-gap semiconductor. In general, the thickness below which the two bands cross will depend inversely on the square root of the band overlap, with 100 Å being the calculated value for Sb. If the barrier materials are the semiconductors in a semimetal/semiconductor multilayer and are thin enough that there is coupling between adjacent semiconductor layers, the entire semimetal/semiconductor multilayer becomes an indirect narrow-gap superlattice. Like naturally-occurring and man-made semiconductors, the indirect gap of the semiconductors converted from semimetals can have a value between zero to several hundred meV. The indirect gap depends on the thickness of the semiconductor layer converted from a semimetal, and the types of barrier materials used.

In the absence of quantum confinement, the band structures of the semimetals Bi and Sb are somewhat similar. See J. P. Issi, *Aust. J. Phys.* 32, 585 (1979), which is incorporated herein by reference. As discussed above, and as illustrated in FIG. 4(a), these Group-V elements are semimetals since the conduction band minimum (3-fold degenerate at the L-point) lies at a lower energy then the valence band maximum (1-fold at the T-point in Bi, 6-fold at the H-point in Sb). The overlap of the two bands is ≈40 meV in Bi and ≈180 meV in Sb. Both electrons and holes have large mass anisotropies $m_2 \gg m_1 m_3$, where for electrons the subscripts 1 through 3 correspond to masses along the bisectrix, binary and trigonal axes, respectively. Several aspects of this band structure arrangement are highly favorable for nonlinear optics. For example, $n_2$ is enhanced by the small optical mass: $m_{op}^* \approx 2/m_1^{-1} + m_2^{-1}$ for propagation along the trigonal axis (the probable growth axis). At the same time, the strong anisotropy yields a large density-of-states effective mass: $m_{ds}^* \approx (m_1^* m_2^* m_3^*)^{1/3}$, which minimizes the high-intensity saturation of $n_2$ due to the dynamic Burstein shift. The multiple conduction and valence minima also enhance the density of states.

Figure 4:
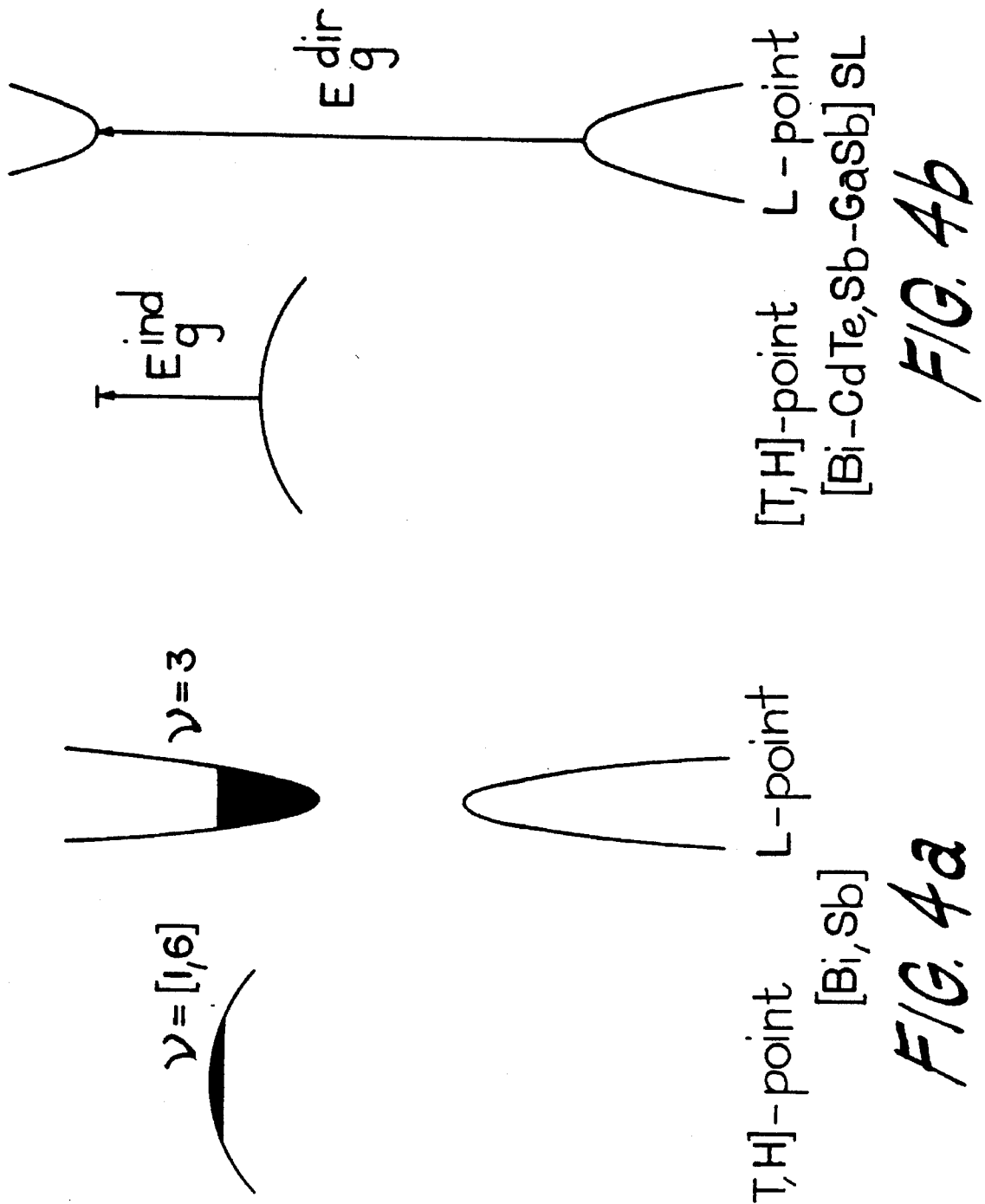
FIG. 4a is a diagram of energy versus wavenumber (k) for Bi or Sb [Bi, Sb] in bulk form.
FIG. 4b is a diagram of energy versus wavenumber (k) for Bi or Sb [Bi, Sb] confined in a quantum well.

By employing quantum confinement in a superlattice incorporating a Group-V semimetal, such as Bi or Sb, and a semiconductor one can create a material with superior nonlinear IR characteristics while eliminating the prior art shortcomings discussed above. With decreasing quantum well thickness, the conduction band of these semimetals will move up in energy while the valence band moves down, as shown in FIG. 4(b). At some point, the two cross and one enters the INGS regime, with its narrow yet tunable energy gap which is indirect in momentum space. As in germanium and silicon, which have much wider indirect gaps, one then expects the Auger recombination lifetime to be orders of magnitude longer than those observed in direct-gap semiconductors with the same $E_g$, due to the difficulty of conserving both momentum and energy. Equally important for nonlinear switching and limiting devices is that the absorption coefficient for optical transitions across the indirect gap ($E_g^{dir}$) will be orders of magnitude smaller than that for the direct transitions in bulk $Bi_{1-x}Sb_x$. These are precisely the properties one wants in an optimized material for nonlinear IR devices. The small absorption coefficient; assures transmission at low intensities, $\alpha L \ll 1$, while the long lifetime yields a large $n_2$.

An INGS meeting the criteria $E_g^{ind} < \hbar\omega < E_g^{dir}$ is suitable as the optical material in an optical switch. The following describes an optical switch employing a suitable INGS as the nonlinear medium. A switch 50 based on total internal reflection (TIR) is disclosed as an example. See FIG. 5. The nonlinear medium 52 is embedded at an angle θ in a linear medium 54 with refractive index no. At low light intensity, the refractive index of the nonlinear medium 52 matches that of the linear medium 54, $n_0$. Therefore,, light (labelled "Input Intensity") entering the switch 50 through the lens 56 passes through the linear and nonlinear media 52 and 54 with negligible reflection at the linear/nonlinear interface 55. The light (labelled "Low Intensity") then exits through the lens 58 with nominal insertion loss. However, the refractive index of the nonlinear medium decreases with increasing intensity: $n = n_0 + n_2 I$, where the nonlinear coefficient $n_2$ is negative for the free-carrier generation mechanism. See above discussion. For a sufficiently large nonlinear index change, the total internal reflection condition: $I_{TIR} = (1 - \sin\theta)n_0/(-n_2)$ is eventually reached. At intensities above $I_{TIR}$, the light beam is totally reflected at the interface 55 between the linear and nonlinear media, and follows the path labeled "High Intensity" in FIG. 5. Thus, the device 50 switches from a nearly 100% transmitting to a nearly 100% reflecting state, depending on whether the input intensity is low or high.

A specific optical switch 50 could consist of GaSb or $Ga_{1-x}Al_xSb$ as the linear medium, a 6μm-thick Sb—GaSb INGS, with well and barrier thicknesses on the order of 60 Å, as the nonlinear medium, and θ=75°. It is predicted that such an optical switch will provide efficient switching for all pulse durations from subnanosecond to seconds, <1% leakage in the switched state, <10% insertion loss, two orders of magnitude dynamic range, and $I_{TIR} < 1kW/cm^2$ in the long pulse limit. Other INGS suitable for optical devices include Bi—PbTe, Bi—CdTe, $Bi_{1-x}Sb_x$—CdTe, $Bi_{1-x}Sb_x$—PbTe, $Bi_{1-x}Sb_x$—GaSb, or $Bi_{1-x}Sb_x$—InSb.

Figure 5:
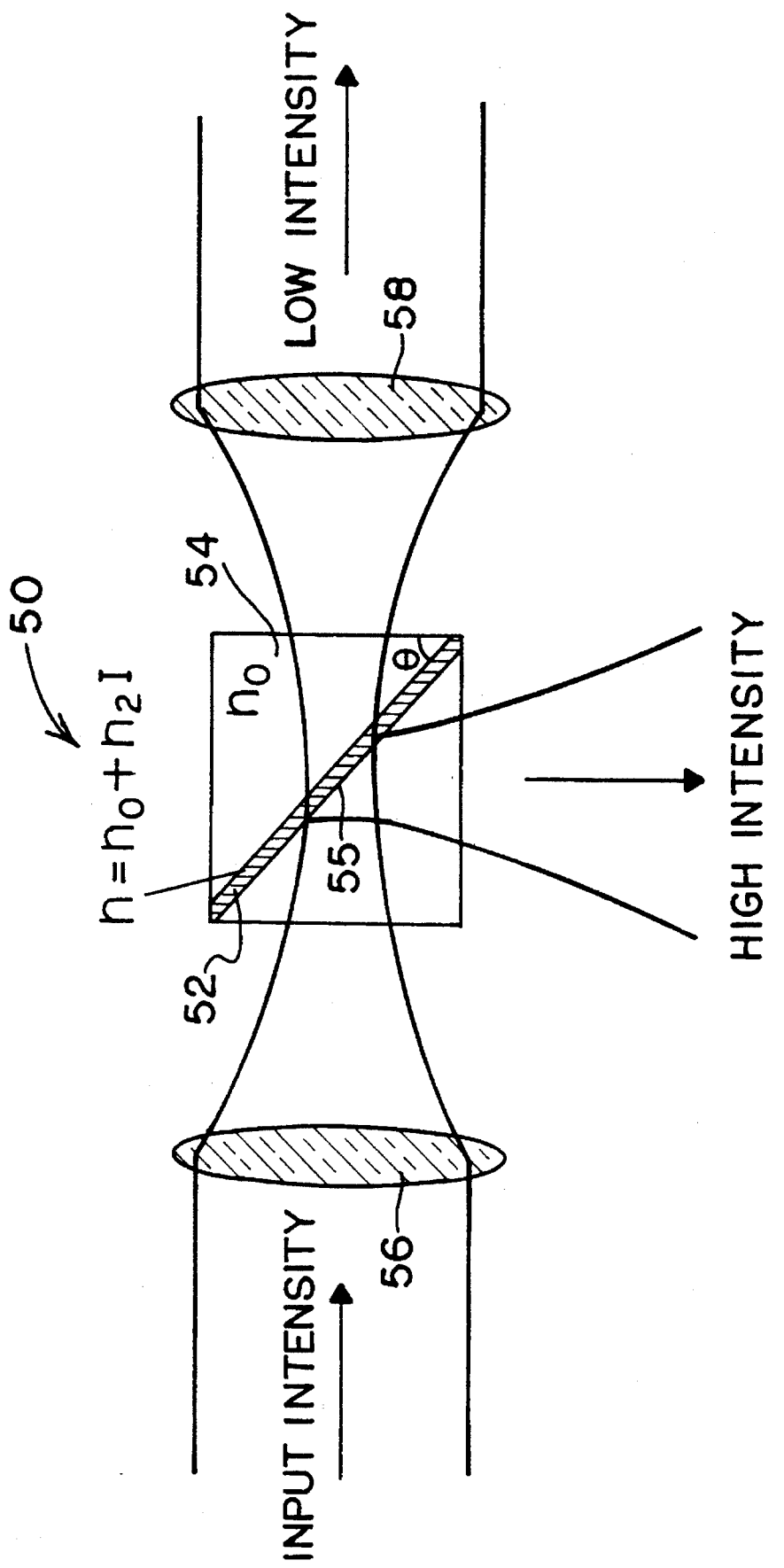
FIG. 5 is a side view representing a total internal reflection switch utilizing optical material fabricated in accordance with the present invention.

The optical gain due to the lenses shown in FIG. 5 can be adjusted to the value which optimizes the desired trade-off between switching threshold, dynamic range, and switch damage susceptibility. In an infrared detector system, the switch and the detector need not be at the same optical gain.

While the optical switch discussed above is a TIR switch, the small absorption coefficient and long lifetimes which are characteristic in INGS should provide similar advantages in other switching configurations such as self-defocusing. INGS are also ideally suited for optical bistability.

The advantages of employing INGS structures as the nonlinear medium in an optical switch include: (1) controlled tuning of the nonlinear properties; (2) lower absorption coefficient; (3) longer recombination lifetime; (4) enhanced saturation properties; and (5) increased resistance to switch damage. Since α and $\tau^{-1}$ are both decreased by approximately the same amount due to momentum conservation requirements, and since the nonlinear refractive index is proportional to the product ατ, one expects nonlinearity in an INGS to be comparable to the large values already determined for the strongly-absorbing materials discussed above in the Background of the Invention. That is, one does not sacrifice $n_2$ in obtaining desirable α and τ. Furthermore, the saturation properties are expected to be superior since in an INGS, weak absorption and large $E_g^{dir}$ can be combined with a small $E_g^{ind}$ (see FIG. 4(b)). A small energy gap yields much weaker saturation due to the dynamic Burstein shift, because the Fermi energy can then be higher in the band for a given photon energy. Besides reducing the insertion loss, the small α has the added advantage that the damage susceptibility of the switch is greatly reduced.

In infrared detectors, the presence of infrared light is detected by monitoring the current or voltage in the optical material. Thus, for infrared detectors, the optical material should provide a long lifetime with an absorption coefficient which is as large as possible, in contrast to the small absorption coefficient required for nonlinear optical switching. This can be achieved in a Bi-based superlattice (e.g., Bi—CdTe) with thicker quantum wells, i.e. less quantum confinement, than for the switch. Other possible Bi-based superlattices include Bi—PbTe, $Bi_{1-x}Sb_x$—PbTe, or $Bi_{1-x}Sb_x$—InSb. While lowest-order calculations suggest that Sb-based superlattices are probably unsuitable for IR detectors since $E_g^{dir} < \hbar\omega$ may not be achievable, it remains possible that the required conditions can be attained, in which case Sb-GaSb and $Bi_{1-x}Sb_x$—GaSb are further materials suitable for detectors. The layer thicknesses are adjusted such that $E_g^{ind} < E_g^{dir} < \hbar\omega$ (in contrast to $\hbar\omega < E_g^{dir}$, for the switch). The absorption coefficient will then be similar to that in bulk Bi, approximately equal to $10^4$ cm$^{-1}$, compared to 1000–2000 cm$^{-1}$ in $Hg_{1-x}Cd_xTe$. See E. R. Youngdale, J. R. Meyer, C. A. Hoffman, F. J. Bartoli, D. L.

Partin, C. M. Thrush and J. P. Heremans, *Appl. Phys. Lett.* 57, 336 (1990), which is incorporated herein by reference. When an electron-hole pair is optically generated at the L-point, intervalley transfer of the hole to the T-point should occur on a picosecond or subpicosecond time scale. Intervalley transfer lifetimes for other semiconductors are on this order. See K. Kash, P. A. Wolff and W. A. Bonner, *Appl. Phys. Lett.* 42, 173 (1983), which is incorporated herein by reference. Recombination of the T-point holes with L-point electrons then requires phonon-assistance, since they are across the indirect energy gap. As discussed above, the recombination lifetime across the indirect energy gap will be an order of magnitude longer than that for direct-gap materials with the same energy gap. See K. Seeger, *Semiconductor Physics* (Springer-Verlag, New York, 1973), which is incorporated herein by reference. Furthermore, by adjusting the CdTe barrier thickness in a Bi—CdTe superlattice, one can tune the effective mass along the growth axis independently of the energy gap. See M. A. Kinch and M. W. Goodwin, *J. Appl. Phys.* 58, 4455 (1985), which is incorporated herein by reference. Since both n-type and p-type doping of Bi have been successfully demonstrated, the existing $Hg_{1-x}Cd_xTe$ technology can be employed as the basis for designing focal plane arrays with Bi—CdTe superlattices as the active IR material. See J. Heremans, D. T. Morelli, D. L. Partin, C. H. Olk, C. M. Thrush and T. A. Perry, *Phys. Rev. B.* 38, 10280 (1988), and M. B. Reine, A. K. Sood and T. J. Tredwell, *Semiconductors and Semimetals*, Vol. 18, ed. R. K. Willardson and A. C. Beer (Academic, New York, 1981), Chapter 6, which are incorporated herein by reference.

In IR detectors, INGS structures will have the following advantages over current $Hg_{1-x}Cd_xTe$ devices: (1) a larger absorption coefficient which allows thinner devices with high quantum efficiency; (2) greatly-enhanced Auger and Shockley-Read recombination lifetimes due to intervalley hole transfer and the indirect band alignment; (3) order-of-magnitude reductions in the tunneling noise, due to the larger effective mass along the growth axis; (4) higher uniformity with zincblende III-V semiconductor material growth; and (5) greater convenience of growth not involving Hg.

The foregoing disclosure and description of the invention are illustrated and explanatory of the preferred embodiments, and changes in the dimension, materials, and fabrication may be made without departing from the spirit of the invention.

What is claimed is:

1. An indirect narrow-gap superlattice useful as the active optical material for an optical switch, comprising:

a first semimetal/semiconductor layer comprising a rhombohedral semimetal grown in a [111] direction on a substrate material having a (111) orientation, and a zincblende semiconductor grown in a [111] direction on said rhombohedral semimetal; and one or more additional semimetal/semiconductor layers grown on said first semimetal/semiconductor layer, each additional semimetal/semiconductor layer comprising a zincblende semiconductor grown in a [111] direction on a rhombohedral semimetal, wherein said rhombohedral semimetal is grown in a [111] direction on said semiconductor of the preceding semimetal/semiconductor layer;

wherein each rhombohedral semimetal sandwiched between zincblende semiconductors has a thickness such that said indirect narrow-gap superlattice has a direct energy gap greater than $\hbar\omega$ and an indirect energy gap less than $\hbar\omega$.

2. The indirect narrow-gap superlattice of claim 1, wherein each said semimetal is $Bi_xSb_{1-x}$, where x ranges from zero to one and each said semiconductor is PbTe, CdTe, GaSb, or InSb.

3. An indirect narrow-gap superlattice useful as the active optical material for an optical detector, comprising:

a first semimetal/semiconductor layer comprising a rhombohedral semimetal grown in a [111] direction on a substrate material having a (111) orientation, and a zincblende semiconductor grown in a [111] direction on said rhombohedral semimetal; and one or more additional semimetal/semiconductor layers grown on said first semimetal/semiconductor layer, each additional semimetal/semiconductor layer comprising a zincblende semiconductor grown in a [111] direction on a rhombohedral semimetal, wherein said rhombohedral semimetal is grown in a [111] direction on said semiconductor of the preceding semimetal/semiconductor layer;

wherein each rhombohedral semimetal sandwiched between zincblende semiconductors has a thickness such that said indirect narrow-gap superlattice has a direct energy gap less than $\hbar\omega$ and an indirect energy gap less than said direct energy gap.

4. The indirect narrow-gap superlattice of claim 3, wherein each said semimetal is $Bi_xSb_{1-x}$, where x ranges from zero to one, and each said semiconductor is PbTe, CdTe, GaSb, or InSb.

5. An optical switch, comprising:

a nonlinear medium, having a first surface, a second surface and a perimeter wall, consisting of an indirect narrow-gap superlattice comprising:

a first semimetal/semiconductor layer comprising a rhombohedral semimetal grown in a [111] direction on a substrate material having a (111) orientation, and a zincblende semiconductor grown in a [111] direction on said rhombohedral semimetal; and one or more additional semimetal/semiconductor layers grown on said first semimetal/semiconductor layer, each additional semimetal/semiconductor layer comprising a zincblende semiconductor grown in a [111] direction on a rhombohedral semimetal, wherein said rhombohedral semimetal is grown in a [111] direction on said semiconductor of the preceding semimetal/semiconductor layer;

wherein each rhombohedral semimetal sandwiched between zincblende semiconductors has a thickness such that said indirect narrow-gap superlattice has a direct energy gap greater than $\hbar\omega$ and an indirect gap less than $\hbar\omega$; and a linear medium having a first surface, a second surface and a perimeter wall, and having a refractive index of $n_o$;

wherein said nonlinear medium is embedded in said linear medium, such that said first surface of said nonlinear medium is positioned at an angle θ in comparison to the first surface of said linear medium.

6. The optical switch of claim 5, wherein said linear medium is a semiconductor.

7. The optical switch of claim 5, wherein each said semimetal is $Bi_xSb_{1-x}$, where x ranges from zero to one, and each said semiconductor is PbTe, CdTe, GaSb, or InSb.

* * * * *